(12) United States Patent
Bharadwaj et al.

(10) Patent No.: US 11,897,762 B2
(45) Date of Patent: Feb. 13, 2024

(54) DIGITAL MICROPHONE WITH OVER-VOLTAGE PROTECTION

(71) Applicant: Knowles Electronics, LLC, Itasca, IL (US)

(72) Inventors: Deepak Bharadwaj, Bengaluru (IN); Payel Mukherjee, Karnataka (IN); Balabrahmachari Matcha, Andhra Pradesh (IN); Gururaj Ghorpade, Karnataka (IN)

(73) Assignee: KNOWLES ELECTRONICS, LLC., Itasca, IL (US)

( * ) Notice: Subject to any disclaimer, the term of this patent is extended or adjusted under 35 U.S.C. 154(b) by 46 days.

(21) Appl. No.: 17/704,667

(22) Filed: Mar. 25, 2022

(65) Prior Publication Data
US 2022/0348458 A1 Nov. 3, 2022

(30) Foreign Application Priority Data
Mar. 27, 2021 (IN) .............................. 202111013641

(51) Int. Cl.
| | | |
|---|---|---|
| *B81C 1/00* | (2006.01) | |
| *H02M 3/156* | (2006.01) | |
| *H04R 1/08* | (2006.01) | |
| *H04R 31/00* | (2006.01) | |

(52) U.S. Cl.
CPC ......... *B81C 1/00238* (2013.01); *H02M 3/156* (2013.01); *H04R 1/083* (2013.01); *H04R 31/006* (2013.01); *B81B 2201/0257* (2013.01)

(58) Field of Classification Search
CPC ...... H02M 3/156; H04R 1/083; H04R 31/006
USPC .......................... 381/111, 112, 122, 116, 150
See application file for complete search history.

(56) References Cited

U.S. PATENT DOCUMENTS

| | | |
|---|---|---|
| 7,190,038 B2 | 3/2007 | Dehe et al. |
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 2005/0207605 A1 | 9/2005 | Dehe et al. |
| 2007/0278501 A1 | 12/2007 | Macpherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |

(Continued)

*Primary Examiner* — Thjuan K Addy
(74) *Attorney, Agent, or Firm* — FOLEY & LARDNER LLP

(57) ABSTRACT

The disclosure relates generally to microphone and vibration sensor assemblies (100) having a transducer (102), like a microelectromechanical systems (MEMS) device, and an electrical circuit (103) disposed in a housing (110) configured for integration with a host device. The electrical circuit includes an output driver circuit, a low drop out (LDO) regulator circuit, and an over-voltage protection circuit with improved capacity and response time.

21 Claims, 6 Drawing Sheets

(56) References Cited

U.S. PATENT DOCUMENTS

| | | |
|---|---|---|
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2019/0353932 A1* | 11/2019 | Langford ............. A61F 2/1624 |

* cited by examiner

DIGITAL MICROPHONE WITH OVER-VOLTAGE PROTECTION

CROSS-REFERENCE TO RELATED PATENT APPLICATION

This application claims and benefit of, and priority to, Indian Provisional Patent Application No. 202111013641 filed Mar. 27, 2021, the entirety of which is incorporated by reference herein.

FIELD OF THE DISCLOSURE

The present disclosure relates generally to microphones and other sensor assemblies and more particularly to digital sensor assemblies having an over-voltage protected output driver, electrical circuits therefor, and methods of operating sensor assemblies.

BACKGROUND

Microphone assemblies comprising a transducer and an integrated circuit disposed in a housing having an electrical interface for integration with a host device are known generally. Such microphones are used in cell phones, personal computers, smart speakers, and internet of things (IoT) devices, among other host devices. However, in some applications microphones and other sensor assemblies can be subject to over-voltage transients caused by energy reflections on electrical conduits like circuit board traces that behave as transmission lines.

BRIEF DESCRIPTION OF THE DRAWINGS

The objects, features and advantages of the present disclosure will become more fully apparent from the following description and appended claims, considered in conjunction with the accompanying drawings. The drawings depict only representative embodiments and are therefore not considered to limit the scope of the disclosure.

Those of ordinary skill in the art will appreciate that the figures are illustrated for simplicity and clarity and therefore may not be drawn to scale and may not include well known features, that the order of occurrence of actions or steps may be different than the order described or be performed concurrently unless specified otherwise, and that the terms and expressions used herein have the meaning understood by those of ordinary skill in the art except where different meanings are attributed to them herein.

DETAILED DESCRIPTION

The present disclosure relates generally to digital microphones and other sensor assemblies comprising a transducer and a current-sink circuit. The current-sink circuit is configured to prevent over-voltage transients on an output channel of the sensor assembly.

Figure 1:
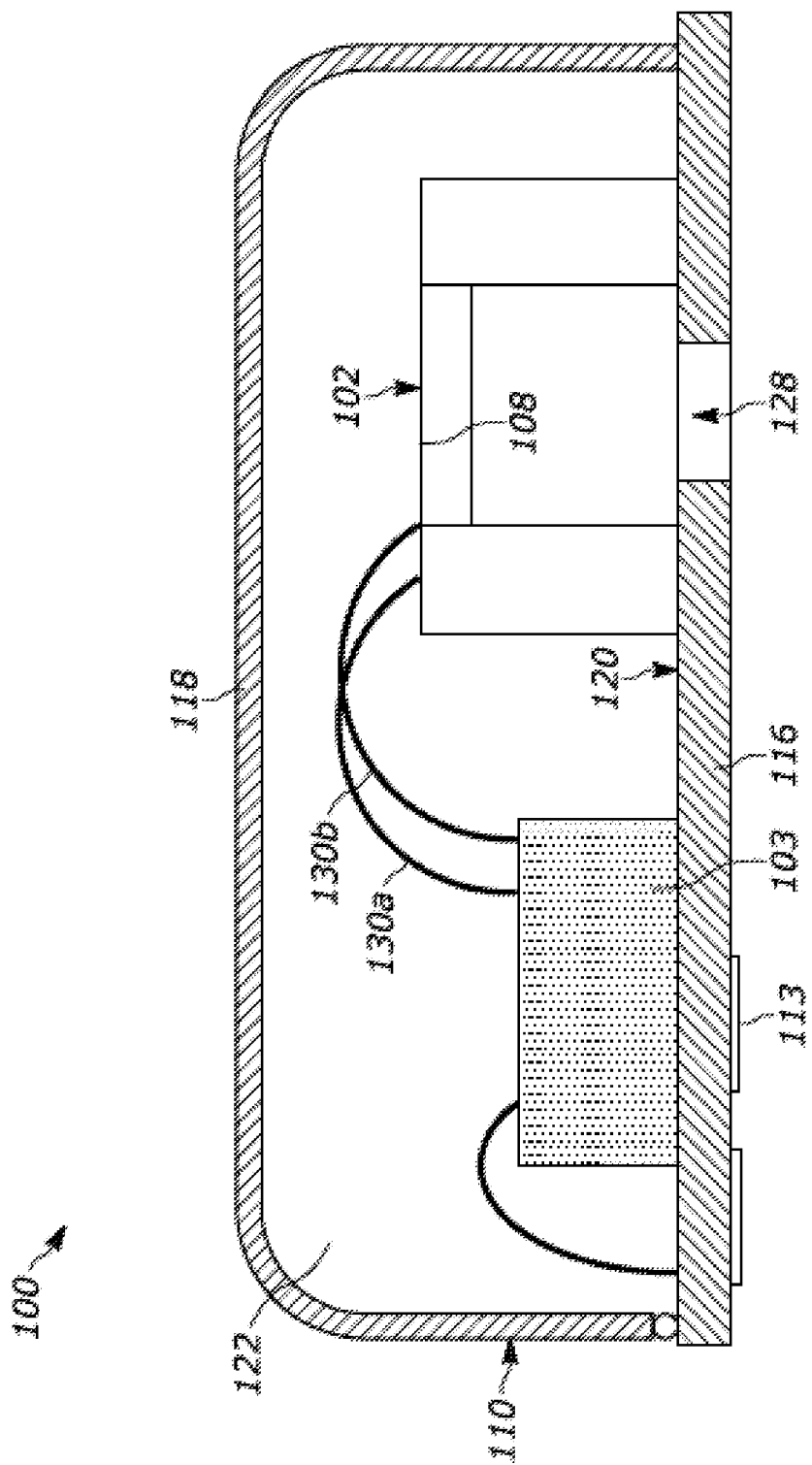
FIG. 1 is a cross-sectional view of a sensor assembly.

The sensor assembly generally comprises a transducer and an electrical circuit disposed in a housing configured to interface with a host device. FIG. 1 is a cross-sectional view of a sensor assembly 100 comprising a transducer 102 coupled to an electrical circuit 103 disposed within a housing 110. The housing includes a base 116 and a cover 118 fastened to an upper surface 120 of the base. In some implementations, the housing shields the transducer and the electrical circuit located within an interior of the housing from electromagnetic interference like RF noise. For this purpose, the cover can be metal or include a conductive portion electrically coupled to a conductive portion of the base. The housing also includes an electrical interface with contacts (e.g., supply, ground, data, clock, select, etc.) configured to interface with a host device. In FIG. 1, the host-interface is a surface-mount interface 113 located on an outer surface of the base 116 and is suitable for reflow soldering processes. In other embodiments, the host-interface can have some other form factor, like through-hole pins, or be located on some part of the housing.

In some sensor assemblies, like microphones, the housing includes an aperture (also called a "port" herein) connecting the interior of the housing to the external environment. In FIG. 1, the housing port 128 is located on the base 116 in alignment with the transducer 102. In other sensor assemblies, the port can be on some other part of the housing, like the cover or sidewall. Other sensor assemblies, like acoustic vibration sensors and accelerometers among others, do not require a port.

Figure 6:
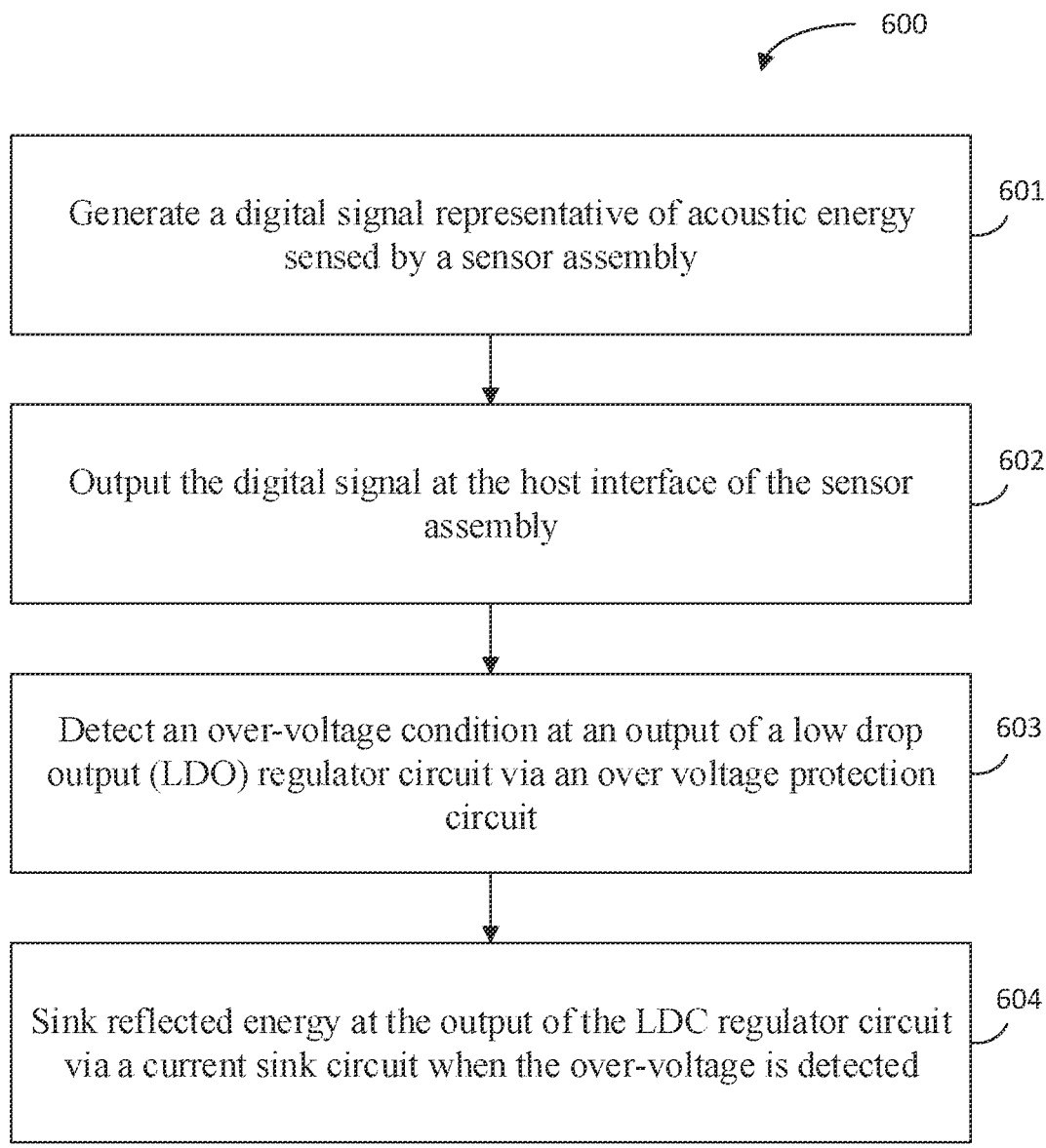
FIG. 6 is a flow diagram representative of a method of operating a sensor assembly having a high-speed and high-capacity current sink circuit.

In one embodiment, the sensor assembly is a microphone assembly and the transducer is configured to detect acoustic signals propagated through the atmosphere and detected by a transducer within the housing. In other embodiments, the sensor assembly is configured to generate an electrical signal representative of vibrations. For example, the sensor assembly can be configured to detect acoustic vibrations propagated through a person's body or an inanimate object. Other sensor assemblies can be configured to detect vibration, pressure, acceleration, humidity, or temperature, among other conditions. In FIG. 6, at 601, the sensor assembly generates an electrical signal representing sound or some other condition sensed by the sensor, examples of which are described herein. The transducer may be a capacitive, piezoelectric, optical or other transduction device implemented as a microelectromechanical systems (MEMS) device or as some other known or future device.

Figure 2:
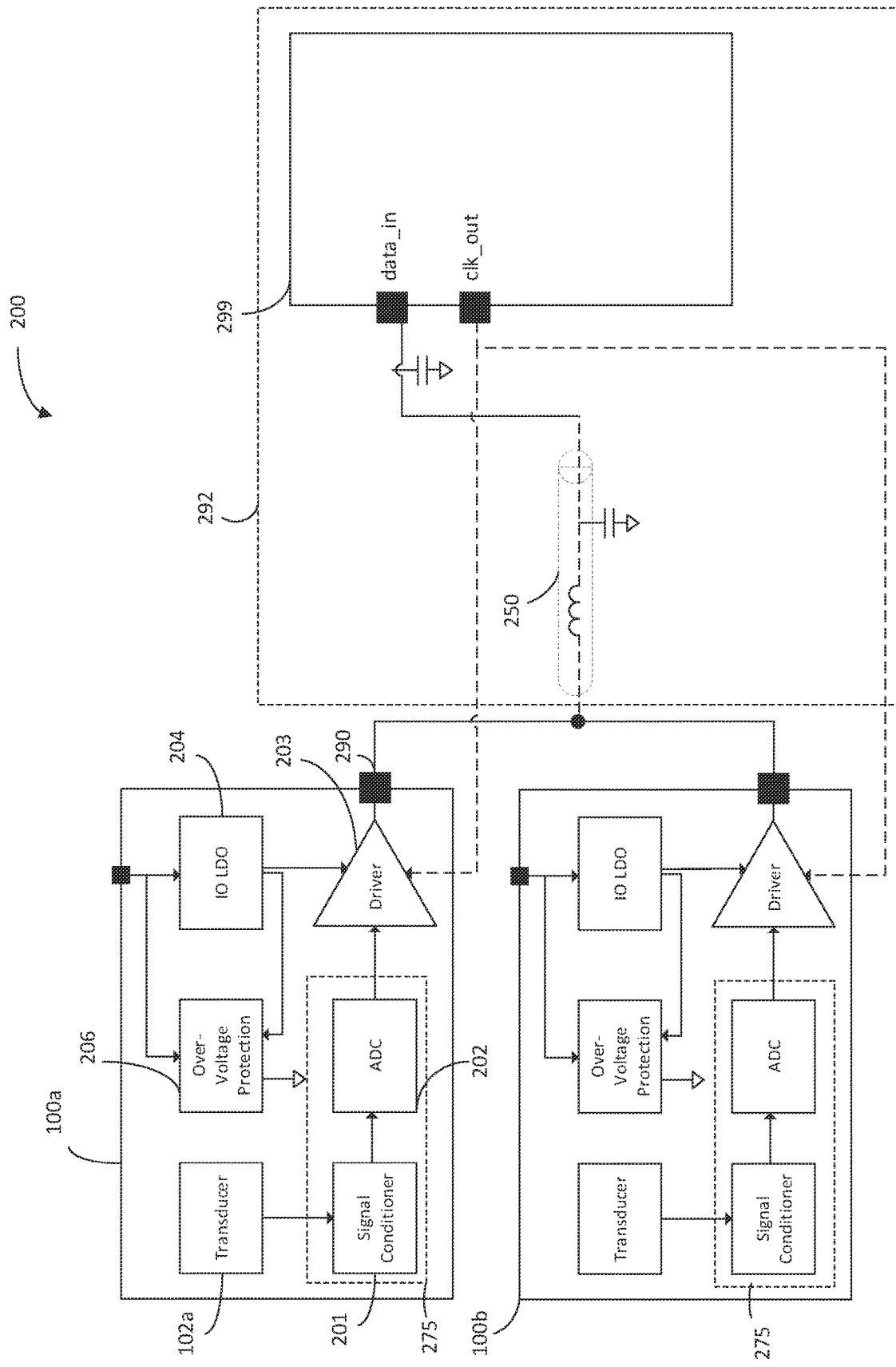
FIG. 2 is a schematic block diagram of a sensor system.

The electrical circuit generally comprises a processing circuit configured to process the electrical signal produced by the transducer and to provide the processed output signal at the host interface of the sensor assembly. In FIG. 1, the electrical circuit 103 is coupled to the transducer 102 via leads 130a and 130b and to contacts on the host interface for this purpose. In FIG. 2, the processing circuit 275 includes a signal conditioner 201 and an analog-to-digital (ADC) circuit 202 configured to receive an analog signal generated by the transducer and output a digital signal representative of the analog signal. In one implementation, the ADC is a multi-bit delta-sigma ADC. The signal conditioner circuit can comprise a low noise amplifier, a buffer, a filter or some combination of these and other signal conditioning circuits. The processing circuit can also comprise, optionally, a digital signal formatting circuit between the digital output of the ADC and an output terminal of the sensor assembly. The formatting circuit can be configured to format the digital signal for a particular digital protocol like PDM or Soundwire, among others. Alternatively, the processing circuit can output a PCM format signal for output host interface. The electrical circuit can also include other circuit elements, depending on the transducer type and the particular sensor configuration, some of which are described herein.

The electrical circuit also comprises an output driver circuit (e.g., an Input/Output driver circuit) coupled to a digital output of the processing circuit and to the output terminal of the sensor assembly. In FIG. 2, the output driver 203 is coupled to the processing circuit and configured to receive a digital signal from the processing circuit and output the digital signal to an external device (e.g., host device), for example, via the host-interface. Thus output 290 of the electrical circuit is electrically coupled to a contact (e.g., the "data" contact) of the host-interface. The output driver circuit 203 is also coupled to a low dropout (LDO) regulator circuit 204 that is configured to provide a regulated bias voltage to the output driver circuit 203. The output 290 is coupled to the host device 299 via the host-interface of the sensor assembly and communicates with host 299 via a transmission line, lead, or trace 250. In FIG. 6, at 602, the electrical circuit outputs a digital signal at the host interface of the sensor assembly.

Reflected energy received at the output driver circuit 203 can produce undesirable over-voltage transients that can cause an error or potentially damage the electrical circuit. Accordingly, the electrical circuit 103 also includes an over-voltage protection circuit 206 coupled to the output driver circuit 203 and configured to sink current associated with the reflected energy. The over-voltage protection circuit 206 is configured to enable a current-sink circuit at the output of the LDO regulator circuit 204 to sink current when a voltage at the output of the LDO exceeds a reference voltage. The threshold can be a reference voltage related to an over-voltage specification of the output driver circuit. Upon detecting the over-voltage condition, the over-voltage protection circuit configures the current sink circuit to sink the reflected energy. In FIG. 6, at 603, the over-voltage protection circuit detects an over-voltage condition at the output of the LDO regulator circuit. For example, the over-voltage can be caused by energy reflected back to the output driver circuit. At 604, the current sink circuit is configured to sink reflected energy when an over-voltage is detected.

Figure 3:
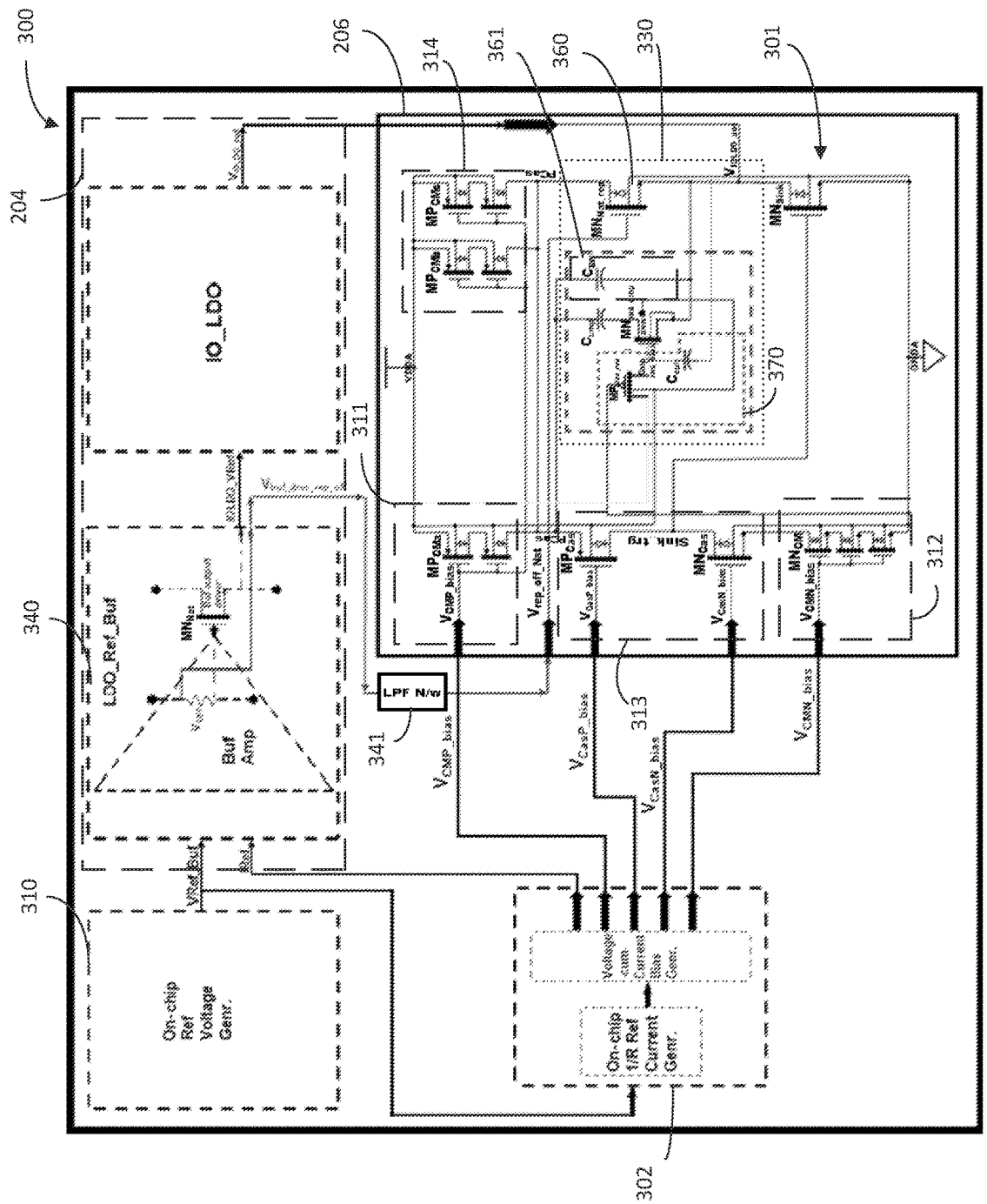
FIG. 3 is a schematic diagram of a voltage regulator circuit and an over-voltage protection circuit.

FIG. 3 depicts an example of an over-voltage protection circuit 206 with the LDO regulator circuit 204. The LDO regulator circuit 204 includes a reference buffer 340 coupled to the over-voltage protection circuit 206 by a low pass filter 341. The reference buffer 340 is configured to output an over-voltage reference that is greater than a reference voltage of the LDO regulator circuit 204, wherein the threshold is based on the over-voltage reference. The low pass filter 341 de-couples the buffer loop from parasitics of the over-voltage protection circuit 206 and provides sufficient capacitance to keep a comparator controlled switch 360 from being affected by transients in the current-sink circuit.

In FIG. 3, the schematic diagram 300 includes a voltage generator 310 such as a band-gap reference or other voltage generator which feeds an independent reference voltage to a reference buffer 340 of the LDO regulator circuit 204. The voltage generator 310 also provides the reference voltage to a reference current generator 302. The reference current generator 302 may be a 1/R reference current generator that is configured to output various signals to bias the over-voltage protection circuit 206.

Figure 4:
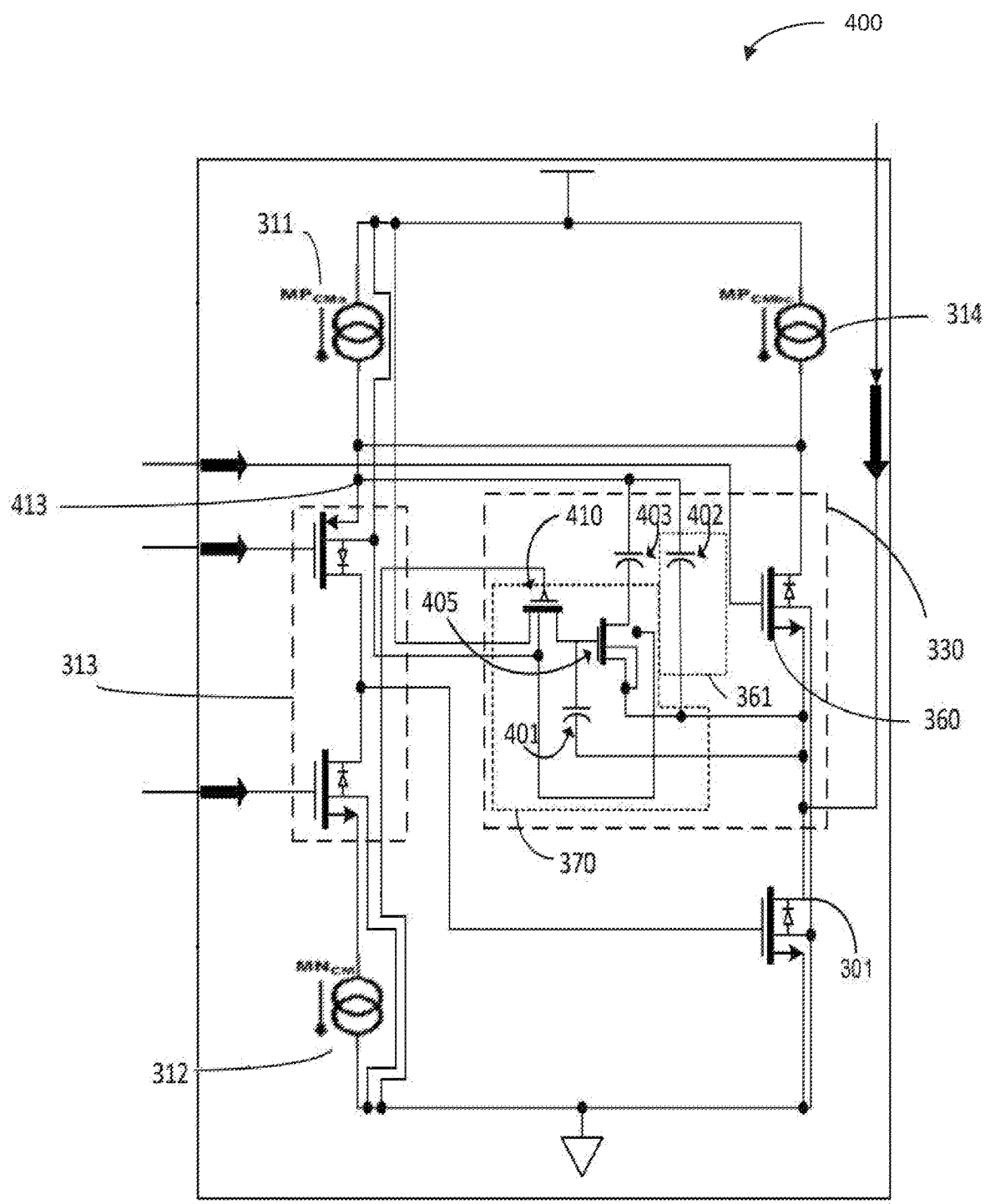
FIG. 4 is a schematic diagram of an over-voltage protection circuit.

In FIG. 3, the over-voltage protection circuit 206 includes a current comparator circuit coupled to the current-sink circuit 301 and a control circuit 330 coupled to the current comparator and configured to change a state of the comparator when a voltage of the reflected energy exceeds a threshold. In an embodiment, the current comparator circuit enables or configures the current-sink circuit 301 to sink current associated with an over-voltage upon changing state. In FIG. 4, the current comparator circuit comprises a first current source 311, a second current source 312 isolated by a cascode circuit 313, and a third current source 314. The cascode circuit 313 stabilizes a current comparator circuit output signal applied to the current-sink circuit 301. In FIG. 3, the current sources are implemented using transistors.

In FIG. 2, the current-sink circuit (e.g., circuit 301 in FIG. 3) of the over-voltage protection circuit 206 is configured to sink current associated with an over-voltage received by the output driver circuit 203 based on the output signal received from the comparator circuit. For example, upon activation or change of the output signal voltage from the current comparator circuit, the current-sink circuit sinks or drains the current from the output of the LDO regulator circuit 204 to ground.

In FIG. 3, a control circuit 330 of the over-voltage protection circuit 206 is configured to provide additional current to the current comparator circuit when the over-voltage exceeds a threshold. The additional current associated with the over-voltage increases a rate at which the current comparator circuit changes state. In an implementation, the control circuit 330 includes a comparator-controlled switch 360 coupled to the output driver circuit and configured to increase a voltage applied to the current comparator circuit when the voltage of the reflected energy exceeds the threshold, and in response, the current comparator circuit changes states in response to the increased voltage. A control terminal of the comparator-controlled switch 360 is coupled to the reference buffer 340 via the low pass filter 341. For example, an increased voltage at an output of LDO regulator circuit 204 causes the comparator-controlled switch 360 to increase a resistance and thereby increase the voltage at a first terminal of the comparator-controlled switch 360 that is connected to a first terminal of the cascode circuit 313, which causes the output signal of the cascode circuit 313 to increase in magnitude and sink the current at the output of the LDO regulator circuit 204. However, the response time of the comparator-controlled switch 360 may not be sufficient to prevent over-voltage conditions caused by reflected energy transients that may appear on the output of the LDO regulator circuit 204.

In some embodiments, the control circuit includes additional circuitry that increases the response time of the over-voltage protection circuit. For example, in FIG. 3 the control circuit 330 includes a variable resistance circuit 370 coupled to the output driver circuit and to the current comparator circuit. The variable resistance circuit 370 is configured to provide the reflected energy to the current comparator circuit in a relatively low resistance state when the voltage of the reflected energy exceeds the threshold. The variable resistance circuit 370 is in a relatively high resistance state when the voltage of the reflected energy does not exceed the threshold. In FIG. 4, the variable resistor circuit 370 includes a first transistor 410 having a control gate coupled to ground, a first terminal coupled to a supply voltage (VDDA shown in FIG. 3), and a second terminal coupled to a control gate of a second transistor 405 and to an output of the LDO regulator circuit via a first capacitor 401. The second transistor 405 includes a first terminal coupled to a first terminal 413 of the cascode circuit 313 via a second capacitor 403 and a second terminal coupled to the output of the LDO regulator circuit. During a voltage spike on the output of LDO regulator circuit, the voltage at the control gate of the second transistor 405 will spike or rise thereby dropping the resistance of the second transistor which causes an output signal of the cascode circuit to approach the supply voltage VDDA thereby improving the response time of the current-sink circuit 301.

Figure 5:
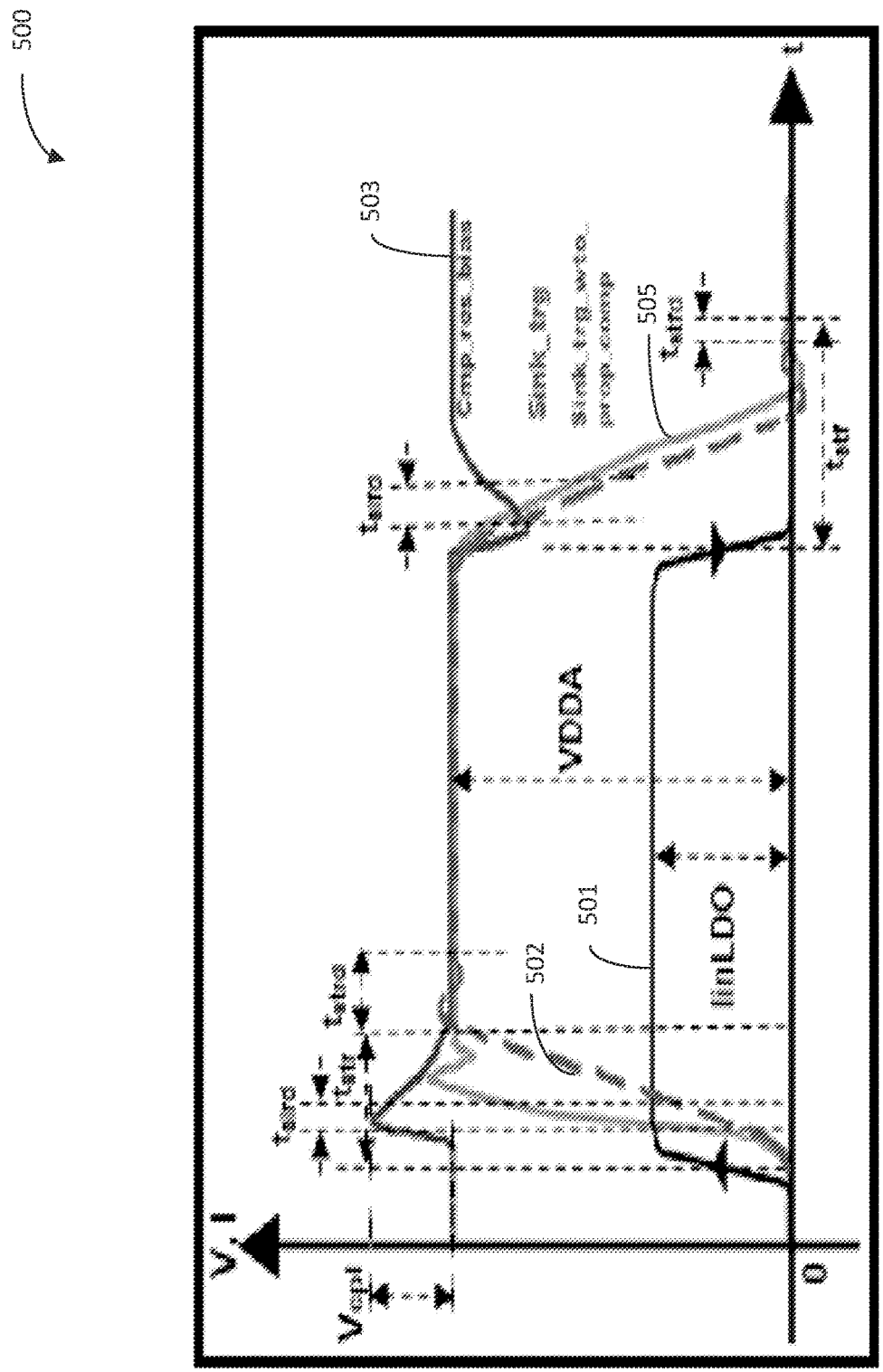
FIG. 5 is a signal diagram of the sensor assembly having an over-voltage protection circuit.

In FIG. 5, a graph 500 of various signals from the over-voltage protection circuit 206 is depicted. A first signal 501 depicts an example of a voltage transient on the output of the LDO regulator circuit 204. A second signal 502 depicts an example output signal to the current-sink circuit 301 without the variable resistor circuit 370. A third signal 503 depicts a second example output signal to the current-sink circuit 301 with the variable resistor circuit 370. A fourth signal 503 depicts a voltage signal the first terminal 413 of the comparator circuit. The pulse in input current depicted by the first signal 501 at a first time is reacted to by a pulse on the fourth signal 503 from the first capacitor 401. The pulse on the fourth signal 503 (e.g., at the gate of the second transistor) causes the resistance of the second transistor 405 to drop to a magnitude that allows the pulse of the first signal 501 to couple to the first terminal 413 of the cascode circuit 313 via the second capacitor 403. This creates additional current in the first terminal 413 that speeds up the state-change of the current-sink circuit 301. As can be seen, the second signal 502 of the circuit not having the control circuit has a worse response time in reacting to the impulse caused by the reflected energy at the output of the LDO regulator 204 than the response time of the third signal 503 having the control circuit 330.

In FIG. 3, the control circuit 330 includes a bandwidth control circuit 361 configured to prevent the current comparator circuit from oscillating between states when the reflected energy received by the output driver circuit oscillates about the threshold at a frequency greater than a pre-set bandwidth of the bandwidth control circuit. In an implementation shown in FIG. 4, the bandwidth control circuit 361 includes a third capacitor 402 coupled between the second terminal of the second transistor 405 and the first terminal 413 of the cascode circuit 313. The third capacitor 402 fixes the loop-bandwidth to the pre-set bandwidth such that parasitic on other nodes are blocked from affecting the comparator circuit. The value of the second capacitor 403 may be selected relative to the value of the third capacitor 402 such that the value of the second capacitor 403 is greater than the value of the third capacitor 402 by a factor of 8 or more. In this way, the transient coupling by the third capacitor 402 between the output of the LDO regulator circuit and the comparator circuit is much less compared to the coupling caused by the second capacitor 403. In some embodiments, the pre-set bandwidth is a characteristic frequency of the over-voltage protection circuit. In some implementations, the control signal is configured to increase a voltage applied to the current comparator circuit when the voltage of the reflected energy exceeds the threshold voltage.

While the disclosure and what is presently considered to be the best mode thereof has been described in a manner establishing possession and enabling those of ordinary skill in the art to make and use the same, it will be understood and appreciated that there are many equivalents to the select embodiments described herein and that myriad modifications and variations may be made thereto without departing from the scope and spirit of the invention, which is to be limited not by the embodiments described but by the appended claims and their equivalents.

What is claimed is:

1. A sensor assembly comprising:
  a transducer configured to generate an analog signal responsive to sensing changes in an environment; and
  an integrated circuit coupled to an output of the transducer, the integrated circuit comprising:
    a signal processing circuit connectable to a transducer of the digital sensor assembly;
    an output driver circuit coupled to the signal processing circuit;
    a low drop out (LDO) regulator circuit coupled to the output driver circuit; and
    an over-voltage protection circuit comprising:
      a current-sink circuit coupled to the output driver circuit and configured to sink current associated with reflected energy received by the output driver circuit;
      a current comparator circuit coupled to the current-sink circuit; and
      a control circuit coupled to the current comparator and configured to change a state of the current comparator when a voltage of the reflected energy exceeds a threshold,
      wherein the current comparator enables the current-sink circuit to sink current associated with the reflected energy upon changing state.

2. The sensor assembly of claim 1, the control circuit configured to provide the reflected energy to the current comparator circuit as additional current when the voltage of the reflected energy exceeds the threshold, wherein the additional current due to the reflected energy increases a rate at which the current comparator circuit changes state.

3. The sensor assembly of claim 2, the control circuit including a bandwidth control circuit configured to prevent the current comparator circuit from oscillating between states when the reflected energy received by the output driver circuit oscillates about the threshold at frequency greater than a bandwidth of the bandwidth control circuit.

4. The sensor assembly of claim 3, the control circuit configured to increase a voltage applied to the current comparator circuit when the voltage of the reflected energy exceeds the threshold.

5. The sensor assembly of claim 2, the control circuit comprising a variable resistance circuit coupled to the output driver circuit and to the current comparator circuit, the variable resistance circuit configured to provide the reflected energy to the current comparator circuit in a relatively low resistance state when the voltage of the reflected energy exceeds the threshold compared, wherein the variable resistance circuit is in relatively high resistance state when the voltage of the reflected energy is does not exceed than the threshold.

6. The sensor assembly of claim 5, the control circuit comprising a switch coupled to the output driver circuit and configured to increase a voltage applied to the current comparator when the voltage of the reflected energy exceeds the threshold, wherein the current comparator circuit changes state in response to the increased voltage.

7. The sensor assembly of claim 6, the control circuit comprising a bandwidth control circuit coupled to the output driver circuit and to the current comparator circuit, the bandwidth control circuit configured to prevent the current comparator circuit from changing state to reflected energy transients received by the output driver circuit.

8. The sensor assembly of claim 1, wherein the over-voltage protection circuit further includes a current comparator circuit-controlled switch configured to output current from the current comparator circuit to the LDO regulator circuit, the current comparator circuit-controlled switch configured to be disabled when the current comparator enables the current-sink circuit.

9. The sensor assembly of claim 1, the current comparator circuit comprising a first current source and a second current source isolated by a cascode circuit, wherein the cascode circuit stabilizes a current comparator circuit output signal applied to the current-sink circuit.

10. The sensor assembly of claim 1, the LDO regulator comprising a reference buffer coupled to the over-voltage regulator circuit by a low pass filter, the reference buffer configured to output an over-voltage reference that is greater than a reference voltage of the LDO regulator, wherein the threshold is based on the over-voltage reference.

11. The sensor assembly of claim 1 is a microphone further comprising a housing having a host-interface and a sound port, wherein the transducer and the integrated circuit are disposed in the housing, the transducer is a MEMS transducer acoustically coupled to the sound port, and the integrated circuit is electrically coupled to contacts on the host-interface.

12. An integrated circuit for interfacing with a transducer of a digital sensor assembly, the integrated circuit comprising:
- a signal processing circuit connectable to a transducer of the digital sensor assembly;
- an output driver circuit coupled to the signal processing circuit;
- a low drop out (LDO) regulator circuit coupled to the output driver circuit; and
- an over-voltage protection circuit comprising:
  - a current-sink circuit coupled to the output driver circuit and configured to sink current associated with reflected energy received by the output driver circuit;
  - a current comparator circuit coupled to the current-sink circuit; and
  - a control circuit coupled to the current comparator and configured to change a state of the current comparator when a voltage of the reflected energy exceeds a threshold,
  - wherein the current comparator enables the current-sink circuit to sink current associated with the reflected energy upon changing state.

13. The integrated circuit of claim 12, the control circuit configured to provide the reflected energy to the current comparator circuit as additional current when the voltage of the reflected energy exceeds the threshold, wherein the additional current due to the reflected energy increases a rate at which the current comparator circuit changes state.

14. The integrated circuit of claim 13, the control circuit including a bandwidth control circuit configured to prevent the current comparator circuit from oscillating between states when the reflected energy received by the output driver circuit oscillates about the threshold at frequency greater than a bandwidth of the bandwidth control circuit.

15. The integrated circuit of claim 14, the control circuit configured to increase a voltage applied to the current comparator circuit when the voltage of the reflected energy exceeds the threshold.

16. The integrated circuit of claim 12, wherein the over-voltage protection circuit further includes a current comparator circuit-controlled switch configured to output current from the current comparator circuit to the LDO regulator circuit, the current comparator circuit-controlled switch configured to be disabled when the current comparator enables the current-sink circuit.

17. The integrated circuit of claim 13, the control circuit comprising a variable resistance circuit coupled to the output driver circuit and to the current comparator circuit, the variable resistance circuit configured to provide the reflected energy to the current comparator circuit in a relatively low resistance state when the voltage of the reflected energy exceeds the threshold compared, wherein the variable resistance circuit is in relatively high resistance state when the voltage of the reflected energy is does not exceed than the threshold.

18. The integrated circuit of claim 17, the control circuit comprising a switch coupled to the output driver circuit and configured to increase a voltage applied to the current comparator when the voltage of the reflected energy exceeds the threshold, wherein the current comparator circuit changes state in response to the increased voltage.

19. The integrated circuit of claim 18, the control circuit comprising a bandwidth control circuit coupled to the output driver circuit and to the current comparator circuit, the bandwidth control circuit configured to prevent the current comparator circuit from changing state to reflected energy transients received by the output driver circuit.

20. The integrated circuit of claim 12, the current comparator circuit comprising a first current source and a second current source isolated by a cascode circuit, wherein the cascode circuit stabilizes a current comparator circuit output signal applied to the current-sink circuit.

21. The integrated circuit of claim 12, the LDO regulator comprising a reference buffer coupled to the over-voltage regulator circuit by a low pass filter, the reference buffer configured to output an over-voltage reference that is greater than a reference voltage of the LDO regulator, wherein the threshold is based on the over-voltage reference.

* * * * *